United States Patent
Lee

(10) Patent No.: US 9,367,162 B2
(45) Date of Patent: Jun. 14, 2016

(54) ORGANIC LIGHT EMITTING DISPLAY APPARATUS HAVING AN ENCAPSULATION LAYER WITH A TOUCH SENSING LAYER AND METHOD OF MANUFACTURING THE SAME

(71) Applicant: Samsung Display Co., Ltd., Yongin, Gyeonggi-Do (KR)

(72) Inventor: Jeong-Yeol Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 484 days.

(21) Appl. No.: 13/830,519

(22) Filed: Mar. 14, 2013

(65) Prior Publication Data

US 2014/0145979 A1    May 29, 2014

(30) Foreign Application Priority Data

Nov. 29, 2012 (KR) ........................ 10-2012-0137334

(51) Int. Cl.
*G06F 3/041* (2006.01)
*G06F 3/044* (2006.01)
*H01L 51/52* (2006.01)
*H01L 27/32* (2006.01)

(52) U.S. Cl.
CPC .............. *G06F 3/0412* (2013.01); *G06F 3/044* (2013.01); *H01L 27/323* (2013.01); *H01L 51/5256* (2013.01); *G06F 2203/04103* (2013.01); *G06F 2203/04111* (2013.01); *H01L 51/5281* (2013.01); *H01L 2251/5338* (2013.01)

(58) Field of Classification Search
CPC .................. G06F 3/0412; G06F 3/044; G06F 2203/04111; G06F 2203/04103; H01L 27/323; H01L 51/5256; H01L 51/5281; H01L 2251/5338

USPC ......... 345/173–174; 178/18.01, 18.06, 18.07; 257/40

See application file for complete search history.

(56) References Cited

U.S. PATENT DOCUMENTS 7,936,338 B2    5/2011 Iwase
2008/0278070 A1 * 11/2008 Kim ............................. 313/504
(Continued)

FOREIGN PATENT DOCUMENTS

JP          2004-145878 A    5/2004
KR    10-2010-0024710 A    3/2010
(Continued)

OTHER PUBLICATIONS

KIPO Office action dated Jan. 9, 2014, for corresponding Korean Patent Application No. 10-2012-0137334 (5 pages).

*Primary Examiner* — Rodney Amadiz
(74) *Attorney, Agent, or Firm* — Lewis Roca Rothgerber Christie LLP

(57) ABSTRACT

An organic light emitting display apparatus including a thin film encapsulation layer having a touch screen structure. The organic light emitting display apparatus includes a substrate; an organic light emitting diode (OLED) layer on the substrate; a thin film encapsulation layer on the OLED layer, and comprising a plurality of inorganic layers and a plurality of organic layers that are alternately stacked; and a touch sensing layer in the thin film encapsulation layer, wherein the touch sensing layer includes: a first touch conductive layer; a touch inorganic layer on the first touch conductive layer; and a second touch conductive layer on the touch inorganic layer, wherein the touch inorganic layer is one of the plurality of inorganic layers included in the thin film encapsulation layer.

20 Claims, 8 Drawing Sheets

(56) References Cited

U.S. PATENT DOCUMENTS

| | | |
|---|---|---|
| 2010/0052521 A1 | 3/2010 | Kim et al. |
| 2010/0200846 A1 | 8/2010 | Kwack et al. |
| 2011/0032209 A1* | 2/2011 | Kim .............................. 345/174 |
| 2011/0242021 A1 | 10/2011 | Jun et al. |
| 2012/0098762 A1 | 4/2012 | Kim et al. |
| 2012/0182233 A1 | 7/2012 | Kim |
| 2014/0061597 A1* | 3/2014 | Choi ................... H01L 51/5284 257/40 |

FOREIGN PATENT DOCUMENTS

| | | |
|---|---|---|
| KR | 10-2010-0090888 | 8/2010 |
| KR | 10-2011-0017674 A | 2/2011 |
| KR | 10-2011-0048683 A | 5/2011 |
| KR | 10-1073147 | 10/2011 |
| KR | 10-2012-0043406 | 5/2012 |
| KR | 10-2012-0047054 A | 5/2012 |
| KR | 10-2012-0083692 | 7/2012 |

* cited by examiner

ORGANIC LIGHT EMITTING DISPLAY APPARATUS HAVING AN ENCAPSULATION LAYER WITH A TOUCH SENSING LAYER AND METHOD OF MANUFACTURING THE SAME

CROSS-REFERENCE TO RELATED PATENT APPLICATION

This application claims priority to and the benefit of Korean Patent Application No. 10-2012-0137334, filed on Nov. 29, 2012, in the Korean Intellectual Property Office, the disclosure of which is incorporated herein in its entirety by reference.

BACKGROUND

1. Field

Embodiments of the present invention relate to an organic light emitting display apparatus, and more particularly, to an organic light emitting display apparatus including a thin film encapsulation layer having a touch-screen structure and a method of manufacturing the same.

2. Description of the Related Art

An organic light emitting display apparatus is a self-emissive display apparatus, which includes a hole injection electrode, an electron injection electrode, and an organic emission layer disposed between the hole injection electrode and the electron injection electrode, and which emits light when excitons (that are generated by combining holes injected from the hole injection electrode and electrons injected from the electron injection electrode in the organic emission layer) enter a ground state from an excited state.

Because the organic light emitting display apparatus is a self-emissive display apparatus that does not need an additional light source, the organic light emitting display apparatus may be driven with a low voltage and formed thin with a light weight. Thus, the organic light emitting display apparatus is considered as a next-generation display apparatus due to high-end characteristics, such as, wide viewing angle, high contrast, and fast response speed.

However, because the organic light emitting display apparatus may degrade due to external moisture and oxygen, the organic light emitting display apparatus may be encapsulated in order to protect the organic light emitting display apparatus against the external moisture and oxygen.

A thin film encapsulation (TFE) including a plurality of inorganic layers or a plurality of layers including organic layers and inorganic layers may be used for encapsulating the organic light emitting display apparatus in order to achieve thin and/or flexible organic light emitting display apparatuses.

A touch panel is an input device that may be easily used by intuitive manipulation of buttons displayed on a display panel by touching the buttons with fingers (or another input device). Touch panels are being applied to various fields, such as document issuing devices used in banks or public offices, medical instruments, guide displays for tourists, and traffic monitors.

A touch panel may be fabricated separately and attached to an organic light emitting display apparatus. However, when the above method is used, a thickness of the display apparatus increases, a process for attaching the touch screen is additionally performed, impurities may infiltrate into the screen during the attaching process, and manufacturing costs increase.

SUMMARY

Embodiments of the present invention provide an organic light emitting display apparatus including a thin film encapsulation layer in which a touch structure is formed.

Embodiments of the present invention also provide a method of manufacturing the organic light emitting display apparatus.

According to an aspect of the present invention, there is provided an organic light emitting display apparatus including: a substrate; an organic light emitting diode (OLED) layer on the substrate; and a thin film encapsulation layer on the OLED layer including: a plurality of inorganic layers; a plurality of organic layers stacked with the inorganic layers; and a touch sensing layer including: a first touch conductive layer; a touch inorganic layer on the first touch conductive layer; and a second touch conductive layer on the touch inorganic layer. Here, the inorganic layers of the thin film encapsulation layer include the touch inorganic layer of the thin film encapsulation layer.

The OLED layer may include: a pixel electrode on the substrate; an intermediate layer on the pixel electrode including an organic emission layer; and an opposite electrode on the intermediate layer.

The first touch conductive layer may include: a plurality of first sensing cells arranged along a first direction on the substrate; a plurality of first connecting patterns for connecting the first sensing cells to each other; and a plurality of second sensing cells arranged along a second direction on the substrate, and the second touch conductive layer may include: contact plugs in the touch inorganic layer electrically connected to portions of the second sensing cells; and a plurality of second connecting patterns electrically connecting the second sensing cells to each other via the contact plugs.

According to an embodiment of the present invention the first touch conductive layer includes a transparent conductive oxide material.

The second touch conductive layer may include: a plurality of first sensing cells arranged along a first direction on the substrate; a plurality of first connecting patterns electrically connecting the first sensing cells to each other; a plurality of second sensing cells arranged along a second direction on the substrate; and contact plugs in the touch inorganic layer electrically connected to the portions of the second sensing cells, and the first touch conductive layer may include a plurality of second connecting patterns electrically connecting the second sensing cells to each other via the contact plugs.

According to an embodiment of the present invention, the second touch conductive layer includes a transparent conductive oxide material.

The thin film encapsulation layer may further include: a first inorganic layer on the OLED layer; a first organic layer on the first inorganic layer; the touch inorganic layer on the first organic layer; a second organic layer on the touch inorganic layer; a second inorganic layer on the second organic layer; and a transparent conductive oxide layer interposed between the touch inorganic layer and the first organic layer or the second organic layer.

The thin film encapsulation layer may further include: a third inorganic layer on the first organic layer; and the touch inorganic layer on the third inorganic layer.

The organic layers of the thin film encapsulation layer may include a lower organic layer under the touch inorganic layer and an upper organic layer on the touch inorganic layer, the first touch conductive layer may be directly between the lower organic layer and a bottom surface of the touch inorganic layer, and the second touch conductive layer may be directly between an upper surface of the touch inorganic layer and the upper organic layer.

According to an embodiment of the present invention the substrate is a flexible substrate.

The organic light emitting display apparatus may further include a protective layer between the OLED layer and the thin film encapsulation layer.

The organic light emitting display apparatus may further include an optical member on the thin film encapsulation layer.

According to an embodiment of the present invention, there is provided a method of manufacturing an organic light emitting display apparatus, the method including: sequentially forming a pixel electrode, an intermediate layer including an organic emission layer, and an opposite electrode on a substrate; and forming a thin film encapsulation layer including a plurality of inorganic layers on the opposite electrode; a plurality of organic layers stacked with the inorganic layers on the opposite electrode; and a touch sensing layer. Here the touch sensing layer includes one of the inorganic layers of the thin film encapsulation layer.

The sequentially forming the pixel electrode, the intermediate layer including the organic emission layer, and the opposite electrode on the substrate may include: forming the pixel electrode on the substrate; forming a pixel defining layer that defines a pixel region and covers opposite edges of the pixel electrode; forming the intermediate layer including the organic emission layer on a region defined by the pixel defining layer; and forming the opposite electrode so as to cover the intermediate layer and the pixel defining layer.

The forming of the thin film encapsulation layer may include: forming a first inorganic layer on the opposite electrode; forming a first organic layer on the first inorganic layer; forming the touch sensing layer on the first organic layer; forming a second organic layer on the touch sensing layer; and forming a second inorganic layer on the second organic layer.

The forming of the touch sensing layer may include: forming a first touch conductive layer; forming a touch inorganic layer on the first touch conductive layer; and forming a second touch conductive layer on the touch inorganic layer. Here, the touch inorganic layer may include one of the inorganic layers of the thin film encapsulation layer.

According to an embodiment of the present invention, there is provided an organic light emitting display apparatus including: a substrate; an organic light emitting diode (OLED) layer on the substrate; a thin film encapsulation layer on the OLED layer including: a plurality of inorganic layers; a plurality of organic layers stacked with the inorganic layers; and a touch sensing layer including a touch inorganic layer including one of the inorganic layers.

The touch inorganic layer may be between two successive organic layers among the organic layers.

The touch sensing layer may further include a first touch conductive layer under the touch inorganic layer, and a second touch conductive layer on the touch inorganic layer.

At least one of the first touch conductive layer and the second touch conductive layer may include a transparent conductive oxide material, and the thin film encapsulation layer further may include the layer that includes the transparent conductive oxide material.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Although a few embodiments of the present invention have been shown and described, it will be appreciated by those skilled in the art that changes may be made in these exemplary embodiments without departing from the spirit of the present invention, the scope of which is defined by the appended claims and their equivalents.

It will be understood that, although the terms first and second are used herein to describe various elements, these elements should not be limited by these terms. These terms are only used to distinguish one element from another element. Thus, a first element discussed below may be termed a second element, and similarly, a second element may be termed a first element, without departing from the teachings of this disclosure.

The terminology used herein is for the purpose of describing particular embodiments only and is not intended to be limiting of the invention. As used herein, the singular forms "a", "an" and "the" may include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
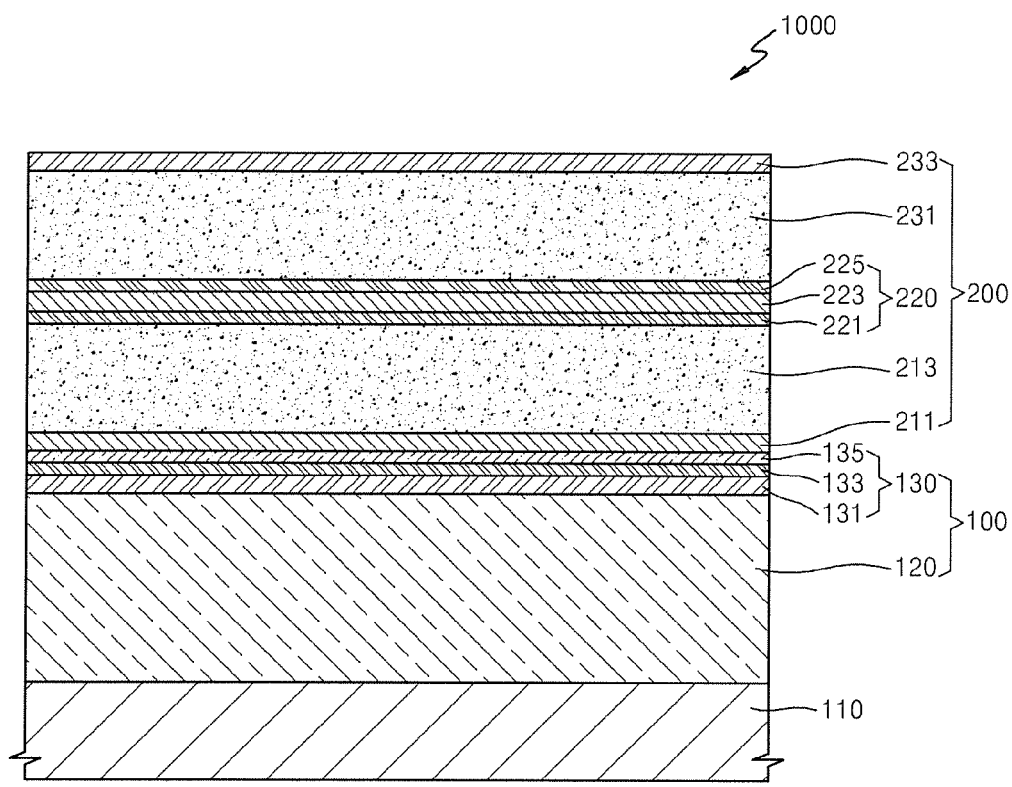
FIG. 1 is a schematic cross-sectional view of an organic light emitting display apparatus according to an embodiment of the present invention.
Figure 2:
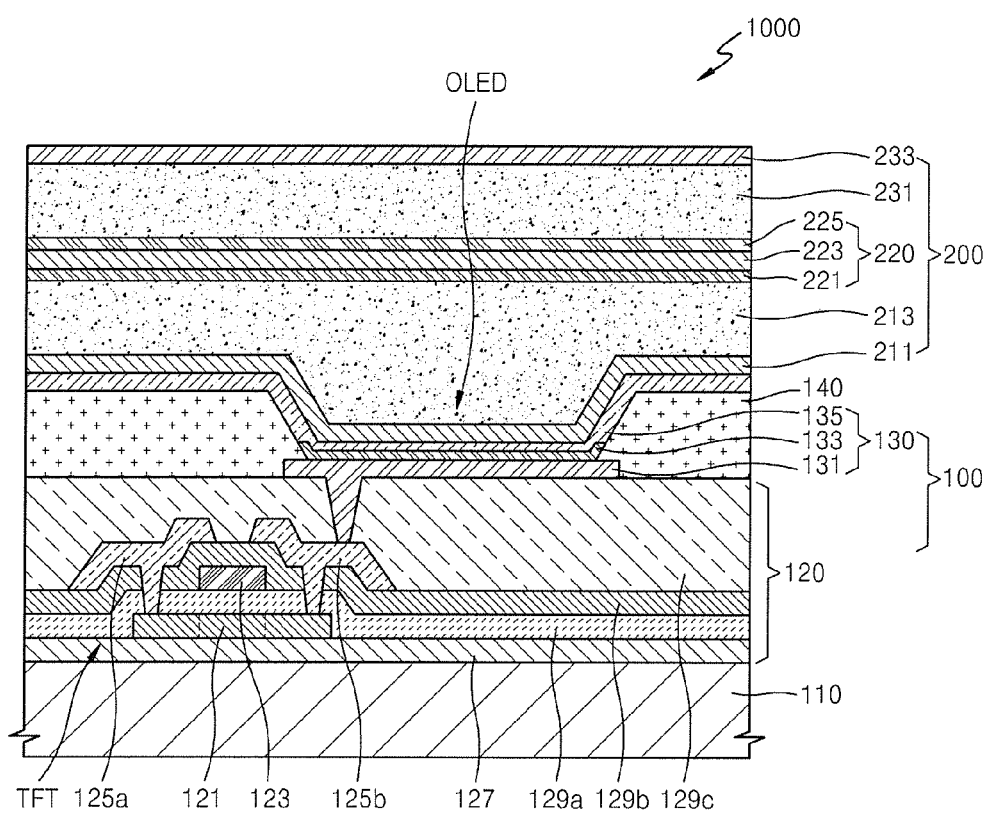
FIG. 2 is a schematic cross-sectional view of a pixel area in the organic light emitting display apparatus of FIG. 1.

FIG. 1 is a schematic cross-sectional view of an organic light emitting display apparatus 1000 according to an embodiment of the present invention. FIG. 2 is a schematic cross-sectional view of a pixel area in the organic light emitting display apparatus 1000 shown in FIG. 1.

Referring to FIGS. 1 and 2, the organic light emitting display apparatus 1000 according to the embodiment of the present invention includes a substrate 110, a display unit 100 on the substrate 110, and a thin film encapsulation layer 200 on the display unit 100. The display unit 100 includes an organic emission device layer 130. The thin film encapsulation layer 200 includes a plurality of inorganic layers 211, 223, and 233 and a plurality of organic layers 213 and 231 that are stacked (e.g., alternately stacked) with each other. The thin film encapsulation layer 200 may include a touch sensing layer 220. The touch sensing layer 220 may include a second inorganic layer 223, and a first touch conductive layer 221 and a second touch conductive layer 225 disposed under and above the second inorganic layer 223, respectively. The second inorganic layer 223 included in the touch sensing layer 220 may be referred to as a touch inorganic layer 223 hereinafter. The touch sensing layer 220 may convert a contact location into an electric signal in order to sense the contact location where a finger of a human being or a touching object directly contacts the organic light emitting display apparatus 1000. For example, the touch sensing layer 220 may have a touching structure of an electrostatic capacitance type.

The substrate 110 may be a flexible substrate. The substrate 110 may be formed of a plastic material having excellent heat resistance and durability, for example, polyimide (PI), polyethylene terephthalate (PET), polyethylene napthalate (PEN), polycarbonate (PC), polyarylate (PAR), polyetherimide (PEI), and polyethersulphone (PES). However, the present invention is not limited thereto, and the substrate 110 may be formed of various materials having flexibility such as a metal foil or a thin glass. In one embodiment the substrate 110 may be a rigid substrate, and here, the substrate 110 may be formed of a glass material (e.g., mainly containing $SiO_2$).

In an embodiment of the present invention that is of a bottom emission type in which images are displayed toward the substrate 110, the substrate 110 is formed of a transparent material. However, in an embodiment of the present invention that is of a top emission type in which images are displayed toward a direction opposite the substrate 110, the substrate 110 may not be formed of a transparent material, for example, the substrate 110 may be formed of metal. When the substrate 110 is formed of metal, the substrate 110 may be formed of one or more selected from the group consisting of carbon, iron, chrome, manganese, nickel, titanium, molybdenum, and stainless steel (SUS); however, the present invention is not limited thereto.

A display unit 100 may be disposed on an upper surface of the substrate 110. The term 'display unit 100' in the present specification generally refers to an organic light emitting diode (OLED) and a thin film transistor (TFT) array, and denotes a part displaying images and a driving part for displaying the images together.

The display unit 100 includes a plurality of pixels arranged as a matrix. Each of the pixels includes an OLED and an electronic device electrically connected to the OLED. The electronic device may include at least two TFTs including a driving TFT and a switching TFT, and a storage capacitor. The electronic device is electrically connected to wires so as to receive electric signals from an outer driving unit and drives. The arrangement of the electronic devices and wires electrically connected to the OLED is referred to as a TFT array.

The display unit 100 includes a device/wiring layer 120 including the TFT array, and an OLED layer 130 including an OLED array.

The device/wiring layer 120 may include a driving TFT for driving an OLED, a switching TFT (not shown), a capacitor (not shown), and wires (not shown) connected to the TFTs and the capacitor. FIG. 2 only shows the driving TFT for driving the OLED for the convenience of description; however, the present invention is not limited thereto, for example, it is well known in the art that a plurality of TFTs, a storage capacitor, and various wires may be further formed.

A buffer layer 127 may be disposed on an upper surface of the substrate 110 in order to planarize the surface and prevent impurities from infiltrating into the substrate 110. The buffer layer 127 may include silicon oxide, silicon nitride, and/or silicon oxynitride, and may be formed by various deposition methods such as plasma enhanced chemical vapor deposition (PECVD), atmospheric pressure CVD (APCVD), and low pressure CVD (LPCVD). In an embodiment of the present invention, the buffer layer 127 may be omitted.

An active layer 121 may be disposed on a region (e.g., a predetermined region) of the buffer layer 127. The active layer 121 may be formed by depositing an inorganic semiconductor material, such as silicon or semiconductor oxide, or an organic semiconductor on a surface (e.g., an entire surface) of the substrate 110 on the buffer layer 127, and patterning the semiconductor in a photolithography process and an etching process.

When the active layer 121 is formed of a silicon material, an amorphous silicon layer may be formed on the entire surface of the substrate 110 and may be crystallized to form a polycrystalline silicon layer, and then, the polycrystalline silicon layer may be patterned and impurities are doped on peripheral regions so as to form the active layer 121 including a source region, a drain region, and a channel region between the source and drain regions.

On the active layer 121, a gate insulating layer 129a including an insulating material, for example, a silicon oxide material, a silicon nitride material, and/or a silicon oxynitride material may be disposed. A gate electrode 123 may be disposed in a region (e.g., a predetermined region) on the gate insulating layer 129a. The gate electrode 123 may be connected to a gate line (not shown) to which a control signal for controlling the TFT is applied.

An interlayer dielectric 129b may be disposed on the gate electrode 123. The interlayer dielectric 129b includes contact holes exposing the source and drain regions of the active layer 121, and a source electrode 125a and a drain electrode 125b may be electrically connected to the source region and the drain region of the active layer 121 via the contact holes of the interlayer dielectric 129b. The TFT formed in the above manner may be covered and protected by a passivation layer 129c.

The passivation layer 129c may include an inorganic insulating layer and/or an organic insulating layer. Examples of the inorganic insulating layer used in the passivation layer 129c may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), barium strontium titanate (BST), lead zirconate-titanate (PZT). In addition, examples of the organic insulating layer used in the passivation layer 129c may include universal polymers (PMMA, PS), polymer derivative having phenol group, acryl-based polymer, imidebased polymer, aryleter-based polymer, amide-based polymer, fluoride-based polymer, p-xylene-based polymer, vinyl alcohol-based polymer, and blends thereof. Otherwise, the passivation layer 129c may have a composite stacked structure in which the inorganic insulating layer and the organic insulating layer are stacked.

An OLED may be disposed on a light emission region on the passivation layer 129c.

The OLED layer 130 may include a pixel electrode 131 formed on the passivation layer 129c, an opposite electrode 135 facing the pixel electrode 131, and an intermediate layer 133 disposed between the pixel electrode 131 and the opposite electrode 135.

When a voltage is applied between the pixel electrode 131 and the opposite electrode 135, the intermediate layer 133 emits light. The intermediate layer 133 may emit, for example, blue light, green light, red light, or white light.

When the intermediate layer 133 emits white light, the organic light emitting display apparatus may further include blue, green, and red color filters for displaying color images.

The organic light emitting display apparatus may be classified as a bottom emission type, a top emission type, or a dual emission type according to a light emitting direction thereof. In the bottom emission type organic light emitting display apparatus, the pixel electrode 131 is formed as a light transmitting electrode, and the opposite electrode 135 is formed as a reflective electrode. In the top emission type organic light emitting display apparatus, the pixel electrode 131 is formed as a reflective electrode, and the opposite electrode 135 is formed as a semi-transmissive electrode. By way of example, embodiments of the present invention having the top emission type, in which the OLED emits light toward the thin film encapsulation layer 200, will be described below.

The pixel electrode 131 may be a reflective electrode. The pixel electrode 131 may include a stacked structure in which a reflective layer and a transparent (or a semi-transparent) electrode layer having a high work function are stacked. The reflective layer may include Ag, Mg, Al, Pt, Pd, Au, Ni, Nd, Ir, Cr, or an alloy thereof. The transparent or semi-transparent electrode layer may include at least one material selected from transparent conductive oxide materials such as indium tin oxide (ITO), indium zinc oxide (IZO), zinc oxide (ZnO), indium oxide ($In_2O_3$), indium gallium oxide (IGO), and aluminum zinc oxide (AZO). The pixel electrode 131 may be patterned as an island corresponding to each of the pixels. The pixel electrode 131 may function as an anode.

A pixel defining layer 140 covering edges of the pixel electrode 131 and having an opening (e.g., a predetermined opening) that exposes a center portion of the pixel electrode 131 may be disposed on the pixel electrode 131. The intermediate layer 133 including an organic emission layer that emits light may be disposed in the opening. The region at which the intermediate layer 133 is disposed may be referred to as an emission area. When the emission area is formed in the opening of the pixel defining layer 140, the pixel defining layer 140 is disposed to protrude between adjacent emission areas, and the protruding regions of the pixel defining layer 140 may be defined as a non-emission area because the organic emission layer is not formed on the protruding regions.

The opposite electrode 135 may be formed of a transmissive electrode. The opposite electrode 135 may be a semi-transparent layer formed of metal such as Li, Ca, LiF/Ca, LiF/Al, Al, Mg, and Ag having a low work function to have a thin thickness. In order to address the high resistance caused by a thin metal semi-transparent layer, a transparent conductive layer formed of a transparent conductive oxide may be stacked on the metal semi-transparent layer. The opposite electrode 135 may be formed on the surface (e.g., the entire surface) of the substrate 110 as a common electrode. The opposite electrode 135 may function as a cathode.

The pixel electrode 131 and the opposite electrode 135 may have opposite polarities to each other.

The intermediate layer 133 includes an organic emission layer for emitting light, and the organic emission layer may be formed of a low-molecular weight organic material or a high-molecular weight organic material. When the organic emission layer 133 is formed of the low-molecular weight organic material, a hole transport layer (HTL) and a hole injection layer (HIL) may be stacked on the organic emission layer 133 toward the pixel electrode 131, and an electron transport layer (ETL) and an electron injection layer (EIL) may be stacked toward the opposite electrode 135. Other functional layers other than the HIL, HTL, ETL, and EIL may also be included.

When the organic emission layer is formed of a high molecular weight material, an HTL (e.g., only an HTL) may be formed on the organic emission layer toward the pixel electrode 131. A high molecular HTL that is formed of poly-(2,4)-ethylene-dihydroxy thiophene (PEDOT) or polyaniline (PANI) may be formed on the pixel electrode 131 in an inkjet printing method or a spin coating method.

In the present embodiment, the OLED layer 130 is disposed on the device/wiring layer 120 in which the TFT is disposed; however, the present invention is not limited thereto. For example, the pixel electrode 131 of the OLED may be formed at the same layer as the active layer 121 of the TFT, the pixel electrode 131 may be formed at the same layer as the gate electrode 123 of the TFT, or the pixel electrode 131 may be formed at the same layer as the source electrode 125a and the drain electrode 125b.

Also, in the present embodiment, the gate electrode 123 of the driving TFT is disposed on the active layer 121; however, the present invention is not limited thereto, for example, the gate electrode 123 may be disposed under the active layer 121.

The thin film encapsulation layer 200 may be disposed on the substrate 110 to cover the display unit 100. The OLED included in the display unit 100 is formed of an organic material, and thus, degrades due to external moisture or oxygen. Therefore, the display unit 100 is sealed. The thin film encapsulation layer 200 is a unit for sealing the display unit 100 and may have a structure in which a plurality of inorganic layers and a plurality of organic layers are stacked (e.g., alternately stacked).

In the organic light emitting display apparatus 1000 according to an embodiment of the present invention, the substrate 110 is a flexible substrate and the thin film encapsulation layer 200 is used as the encapsulation unit, and accordingly, the organic light emitting display apparatus 1000 may be manufactured to be flexible and thin.

As described above, because the display unit 100 is sealed by the thin film encapsulation layer 200 and not by a sealing substrate, the organic light emitting display apparatus 1000 may be formed thin and flexible.

The thin film encapsulation layer 200 may include a plurality of inorganic layers 211, 223, and 233 and a plurality of organic layers 213 and 231. The inorganic layers 211, 223, and 233 and the organic layers 213 and 231 may be alternately stacked.

The inorganic layers 211, 223, and 233 may be formed of a metal oxide, a metal nitride, a metal carbide, or a combination thereof. For example, the inorganic layers 211, 223, and 233 may be formed of aluminum oxide, silicon oxide, or silicon nitride. According to another embodiment, the inorganic layers 211, 223, and 233 may include a stacked structure of a plurality of inorganic insulating layers. The inorganic layers 211, 223, and 233 prevent the external moisture and/or oxygen from infiltrating into the OLED layer 130.

The organic layers 213 and 231 may include a high molecular organic compound. For example, the organic layers 213 and 231 may include one of epoxy, acrylate, or urethane acrylate. The organic layers 213 and 231 may lessen internal stress of the inorganic layers 211, 223, and 233, or compensate for defects of the inorganic layers 211, 223, and 233 and planarize the inorganic layers 211, 223, and 233.

According to an embodiment of the present invention, a first touch conductive layer 221 and a second touch conductive layer 225 are disposed in the thin film encapsulation layer 200, and the first touch conductive layer 221, the second inorganic layer 223, and the second touch conductive layer 225 may configure a touch sensing layer 220.

The touch sensing layer 220 according to the embodiment of the present invention may include first sensing patterns extending in a first direction and second sensing patterns extending in a second direction. The first direction and the second direction may be perpendicular (or substantially perpendicular) to each other, and the first sensing patterns and the second sensing patterns may overlap each other while being insulated from each other. When a finger of a human being or a touching object contacts the thin film encapsulation layer 200 on the touch sensing layer 220, capacitance between the first sensing patterns and the second sensing patterns varies. The contact location may be determined by sensing an electric signal corresponding to the variation of the electric capacitance of the first sensing patterns and the second sensing patterns.

According to an embodiment, the first sensing patterns may be formed in the first touch conductive layer 221, and the second sensing patterns may be formed in the second touch conductive layer 225. The second inorganic layer 223 may be disposed between the first touch conductive layer 221 and the second touch conductive layer 225. In an embodiment of the present invention, the first and second touch conductive layers 221 and 225 may be formed of a transparent conductive oxide material. Examples of the transparent conductive oxide may include ITO, IZO, ZnO, In$_2$O$_3$, IGO, and AZO.

According to an embodiment of the present invention, the first sensing pattern may include first sensing cells and first connecting patterns for connecting the first sensing cells, and the second sensing pattern may include second sensing cells and second connecting patterns for connecting the second sensing cells. The first and second sensing cells may be formed in the first touch conductive layer 221. The first connecting patterns may be formed in the first touch conductive layer 221, and the second connecting patterns may be formed in the second touch conductive layer 225. The first touch conductive layer 221 may be formed of a transparent conductive oxide. The second touch conductive layer 225 may be formed of a low-resistive metal material. This embodiment will be described in detail below with reference to FIGS. 4A through 4C.

According to an embodiment of the present invention, the first sensing pattern may include first sensing cells and first connecting patterns for connecting the first sensing cells, and the second sensing pattern may include second sensing cells and second connecting patterns for connecting the second sensing cells. The first and second sensing cells may be formed on the second touch conductive layer 225. The first connecting patterns may be formed in the second touch conductive layer 225, and the second connecting patterns may be formed in the first touch conductive layer 221. The second touch conductive layer 225 may be formed of a transparent conductive oxide. The first touch conductive layer 221 may be formed of a low-resistive metal material. This embodiment will be described in detail below with reference to FIGS. 5A through 5C.

According to the present embodiment, the thin film encapsulation layer 200 includes the first touch conductive layer 221 and/or the second touch conductive layer 225 that may be formed of a transparent conductive oxide, as well as the inorganic layers 211, 223, and 233 and the organic layers 213 and 231. Therefore, the organic light emitting display apparatus 1000 may have a mechanically firm structure, and may have improved moisture infiltration prevention function and sealing performance. Moreover, one inorganic layer 223 among the plurality of inorganic layers 211, 223, and 233 configuring the thin film encapsulation layer 200 is used as the touch sensing layer 220, and thus, manufacturing processes may be simplified. Also, since the touch screen function may be realized by using the touch sensing layer 220 in the thin film encapsulation layer 200 without using an additional touch panel, the organic light emitting display apparatus 1000 may be formed thin and flexible.

Figure 3A:
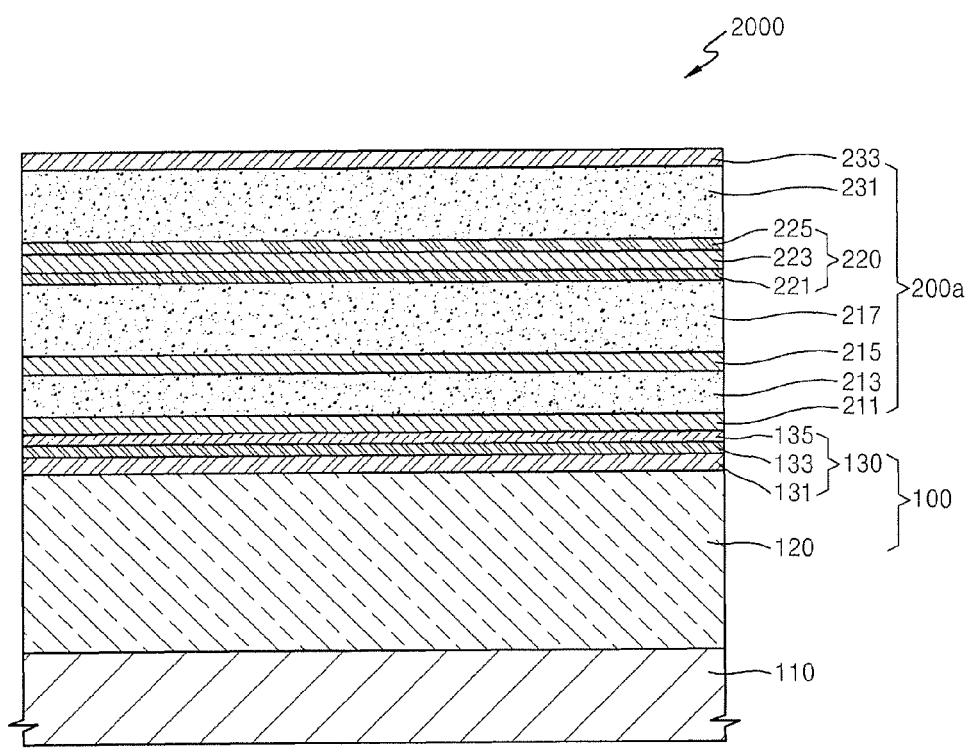
FIG. 3A is a schematic cross-sectional view of an organic light emitting display apparatus according to another embodiment of the present invention.

FIG. 3A is a cross-sectional view schematically showing an organic light emitting display apparatus 2000 according to an embodiment of the present invention.

The embodiment illustrated in FIG. 3A includes elements similar to those described above, the description of these similar elements are given, at least in part, by way of reference to the above description. Differences from the organic light emitting display apparatus 1000 shown in FIGS. 1 and 2, however, will be described in detail below.

Referring to FIG. 3A, the organic light emitting display apparatus 2000 of the present embodiment has the same (or substantially similar) structure as that of the organic light emitting display apparatus 1000 shown in FIGS. 1 and 2, except for that a thin film encapsulation layer 200a further includes an inorganic layer 215 and an organic layer 217.

Two inorganic layers 211 and 215 and two organic layers 213 and 217 may be alternately stacked between the display unit 100 and the touch sensing layer 220. In the present embodiment, the two inorganic layers 211 and 215 and the two organic layers 213 and 217 are stacked under the touch sensing layer 220; however, the present invention is not limited thereto, for example, more inorganic layers and organic layers may be stacked between the display unit 100 and the touch sensing layer 220.

In the present embodiment, one organic layer 231 and one inorganic layer 233 are stacked on the touch sensing layer 220; however, the present invention is not limited thereto. For example, more inorganic layers and organic layers may be stacked on the touch sensing layer 220.

In addition, the stacking order of the inorganic layers 211, 215, 223, and 233 and the organic layers 213, 217, and 231 may vary. In the present embodiment, the inorganic layer 211 is stacked on the display unit 100; however, the present invention is not limited thereto, for example, the organic layer 213 may be stacked on the display unit 100. Also, in FIG. 3A, the inorganic layer 233 is the uppermost layer of the thin film encapsulation layer 200a; however, the organic layer 231 may be the uppermost layer of the thin film encapsulation layer 200a.

Also, in FIG. 3A the touch sensing layer 220 is disposed directly on the organic layer 217; however, the present invention is not limited thereto, and the touch sensing layer 220 may be directly disposed on the inorganic layer 215 or another inorganic layer may be disposed between the touch sensing layer 220 and the organic layer 217.

Also, in the present embodiment, the organic layer 231 is disposed directly on the touch sensing layer 220; however, the present invention is not limited thereto, and the inorganic layer 233 may be directly disposed on the touch sensing layer 220 or another inorganic layer may be disposed between the touch sensing layer 220 and the organic layer 231.

Figure 3B:
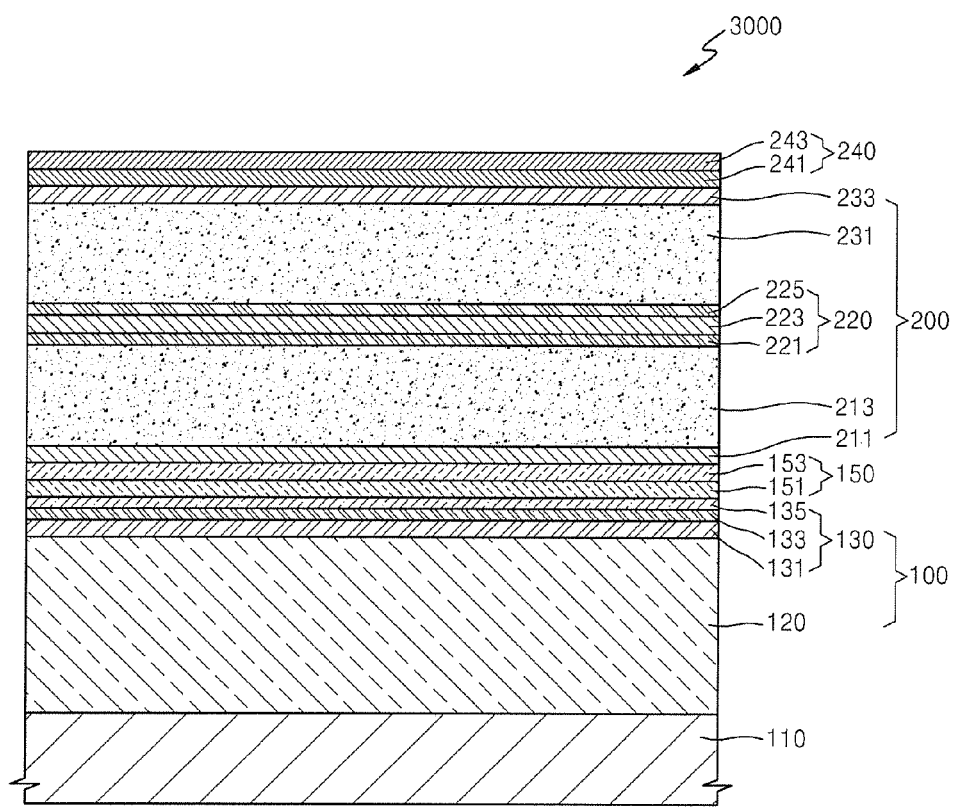
FIG. 3B is a schematic cross-sectional view of an organic light emitting display apparatus according to another embodiment of the present invention.

FIG. 3B is a schematic cross-sectional view of an organic light emitting display apparatus 3000 according to an embodiment of the present invention.

Referring to FIG. 3B, configurations of the organic light emitting display apparatus 3000 are the same (or substantially the same) as those of the organic light emitting display apparatus 1000 described with reference to FIGS. 1 and 2, except that a protective layer 150 is disposed between the display unit 100 and the thin film encapsulation layer 200 and an optical member 240 is disposed on the thin film encapsulation layer 200. These differences are described below in detail.

The protective layer 150 may include a capping layer 151 and a shielding layer 152. The capping layer 151 may be formed of an organic material such as a-NPD, NPB, TPD, m-MTDATA, $Alq_3$, or CuPc. The capping layer 151 protects the OLED layer 130, and allows light emitted from the OLED layer 130 to be transmitted to outside.

The shielding layer 152 may be formed of an inorganic material such as LiF, $MgF_2$, or $CaF_2$. The shielding layer 152 shields against plasma used to form the thin film encapsulation layer 200, so that the plasma may not infiltrate into the OLED layer 130 and damage the intermediate layer 133 and the opposite electrode 135.

The optical member 240 may be disposed on the thin film encapsulation layer 200. The optical member 240 may include a phase retarder 241 and a polarization plate 243. The phase retarder 241 may be a quarter-wave (λ/4) plate.

The optical member 240 of the organic light emitting display apparatus 3000 restrains external light from being reflected, thereby improving visibility and contrast of the organic light emitting display apparatus 3000.

Figure 4A:
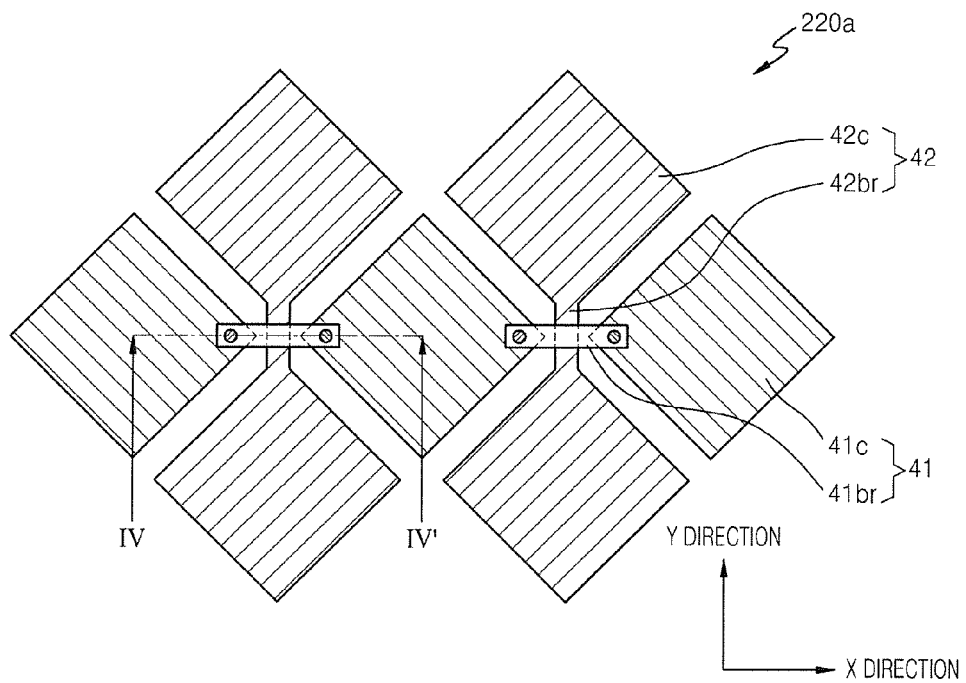
FIG. 4A is a schematic plan view of a touch sensing layer of a thin film encapsulation layer according to an embodiment of the present invention.
Figure 4B:
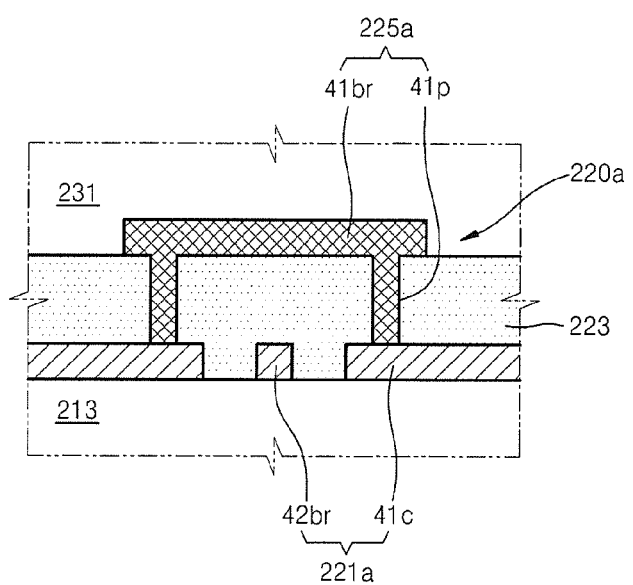
FIG. 4B is a schematic cross-sectional view of the touch sensing layer taken along the line IV-IV' of FIG. 4A.

FIG. 4A is a schematic plan view of a touch sensing layer 220a disposed in the thin film encapsulation layer 200, according to an embodiment of the present invention, and FIG. 4B is a schematic cross-sectional view of the touching sensing layer 220a taken along the line IV-IV of FIG. 4A.

Referring to FIGS. 4A and 4B, the touch sensing layer 220a disposed in the thin film encapsulation layer 200 includes first sensing patterns 41 and second sensing patterns 42.

The first sensing patterns 41 may extend in a first direction (for example, an X-axis direction). The plurality of first sensing patterns 41 may be arranged along a second direction (for example, a Y-axis direction) crossing the first direction. The first sensing patterns 41 may include a plurality of first sensing cells 41c that are spaced from each other at suitable (e.g., predetermined) intervals along the first direction, and first connecting patterns 41br connecting the first sensing cells 41c to each other. The first connecting patterns 41br may be disposed at a different layer from that of the first sensing cells 41c, and the first connecting patterns 41br may electrically connect the first sensing cells 41c to each other as bridges by using contact plugs 41p that penetrate through the second inorganic layer 223.

The second sensing patterns 42 may extend in the second direction. The plurality of second sensing patterns 42 are arranged along the first direction. The second sensing patterns 42 may include a plurality of second sensing cells 42c spaced apart from each other at suitable (e.g., predetermined) intervals in the second direction, and second connecting patterns 42br for connecting the second sensing cells 42c to each other. The second sensing cells 42c may be arranged between the first sensing cells 41c so as not to overlap with the first sensing cells 41c. The second connecting patterns 42br may be disposed at the same layer as that of the second sensing cells 42c, and the second connecting patterns 42br and the second sensing cells 42c may be integrally formed with each other.

As shown in FIG. 4A, the first sensing cells 41c and the second sensing cells 42c may be formed having a lozenge-shaped; however, the present invention is not limited thereto. Also, the first sensing cells 41c and the second sensing cells 42c may be formed differently from each other.

The first sensing cells 41c, the second sensing cells 42c, and the second connecting patterns 42br may be disposed on the first organic layer 213, and configure a first touch conductive layer 221a. As described above, the first touch conductive layer 221a may be formed of a transparent conductive oxide.

The first connecting patterns 41br and the contact plugs 41p may configure a second touch conductive layer 225a, and may be formed of a transparent conductive material or a low resistive metal material such as molybdenum (Mo), silver (Ag), titanium (Ti), copper (Cu), aluminum (Al), and Mo/Al/Mo. The second inorganic layer 223 and the second touch conductive layer 225a may be covered by the second organic layer 231.

Figure 4C:
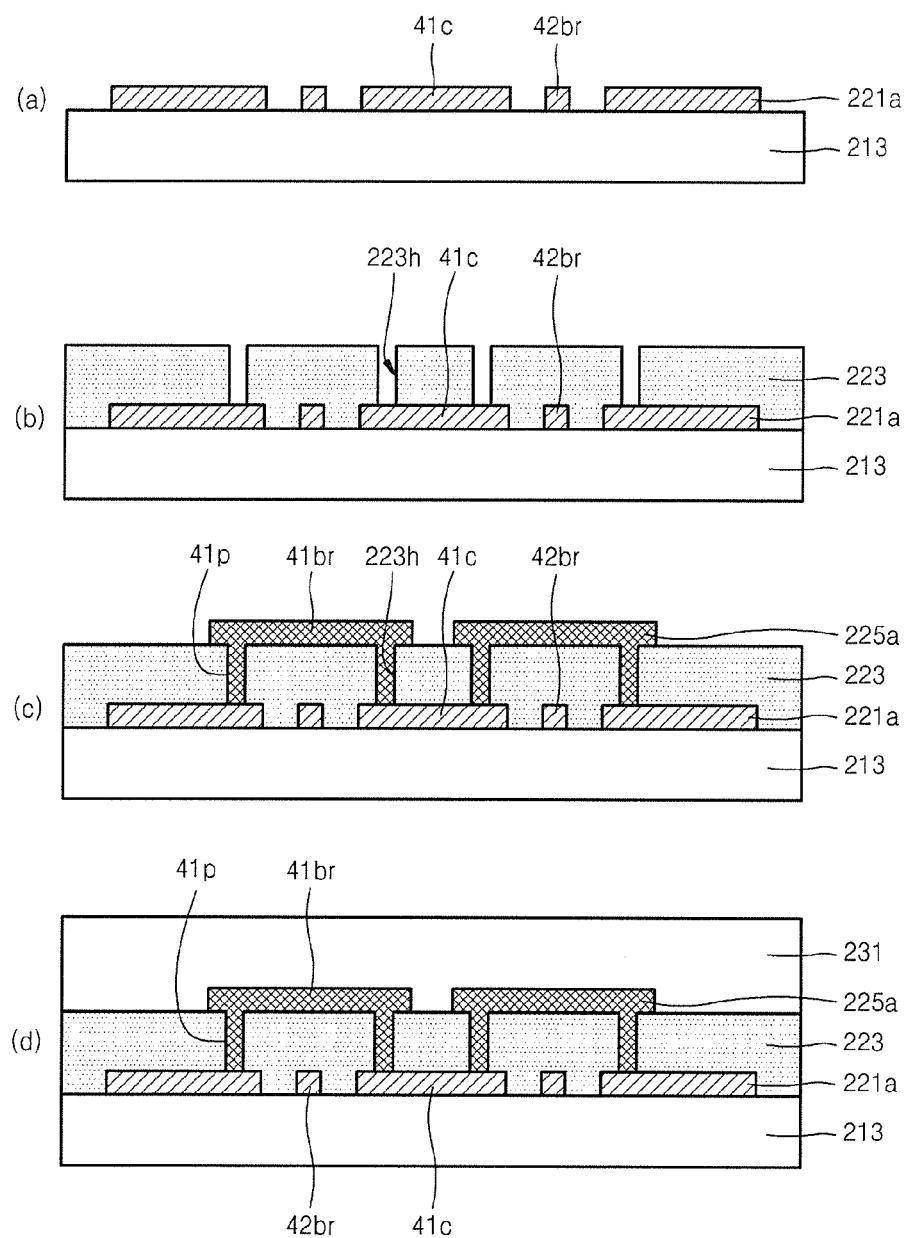
FIG. 4C depicts schematic cross-sectional views illustrating a method of forming a touch sensing layer disposed in the thin film encapsulation layer, according to an embodiment of the present invention.

FIG. 4C depicts schematic cross-sectional views illustrating a method of forming the touch sensing layer 220a in the thin film encapsulation layer 200, according to an embodiment of the present invention.

Referring to (a) of FIG. 4C, the first touch conductive layer 221a may be formed on the first organic layer 213. The first touch conductive layer 221a may include the first sensing cells 41c, the second sensing cells 42c, and the second connecting patterns 42br. The first touch conductive layer 221a may be formed of a transparent conductive material. For example, a transparent conductive material layer may be disposed on the first organic layer 213. The transparent conductive material layer may be patterned by a photolithography process using a first photo mask (not shown) and an etching process, thereby forming the first sensing cells 41c, the second sensing cells 42c, and the second connecting patterns 42br.

Referring to (b) of FIG. 4C, the second inorganic layer 223 may be formed on the first touch conductive layer 221a. The second inorganic layer 223 may include contact holes 223h exposing upper parts of the first sensing cells 41c. As described above, the second inorganic layer 223 may be formed of an inorganic insulating material. For example, an inorganic insulating material layer may be disposed on the first touch conductive layer 221. The inorganic insulating material layer may be patterned by a photolithography process using a second photo mask (not shown) and an etching process, thereby forming the contact holes 223h exposing parts of the upper surface of the first sensing cells 41c.

Referring to (c) of FIG. 4C, a second touch conductive layer 225a may be formed on the second inorganic layer 223. The second touch conductive layer 225a may include the first connecting patterns 41br, and contact plugs 41bp for burying (or filling) the contact holes 223 of the second inorganic layer 223. The second touch conductive layer 225a may be formed of a low-resistive metal material. For example, a low-resistive metal material layer may be disposed on the second inorganic layer 223 so as to bury (or fill) the contact holes 223h. The low-resistive metal material layer may be patterned by a photolithography method using a third photo mask (not shown) and an etching process, thereby forming the first connecting patterns 41br and the contact plugs 41p.

Referring to (d) of FIG. 4C, the second organic layer 231 may be formed on the second inorganic layer 223 and the second touch conductive layer 225a. Through the above described processes, the touch sensing layer 220a disposed in the thin film encapsulation layer 200 may be formed.

Figure 5A:
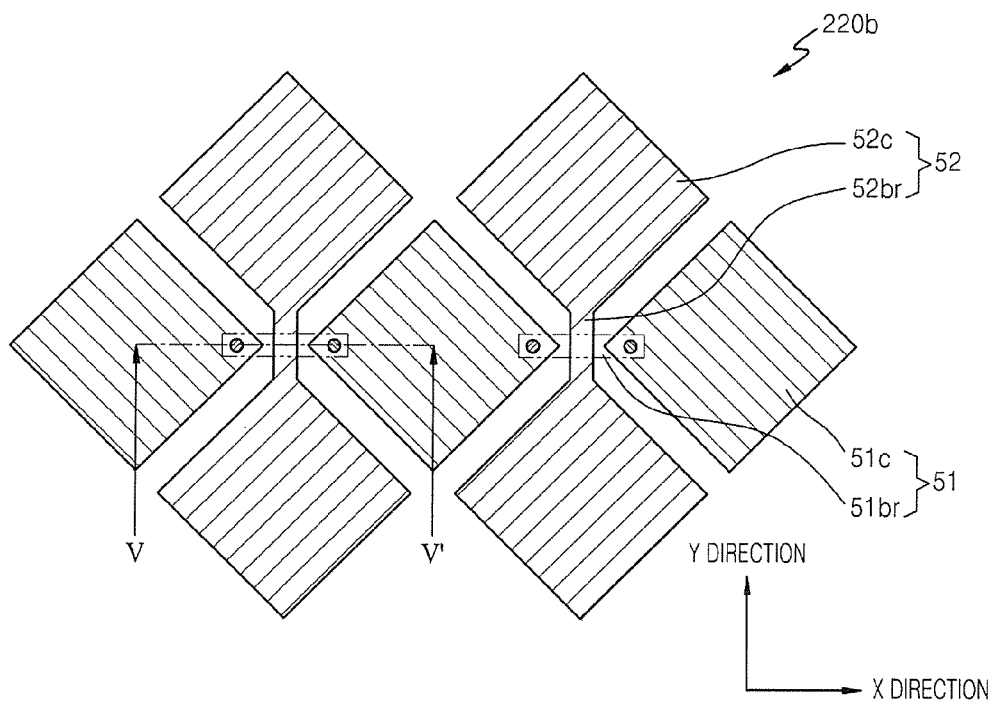
FIG. 5A is a schematic plan view of a touch sensing layer of a thin film encapsulation layer according to an embodiment of the present invention.
Figure 5B:
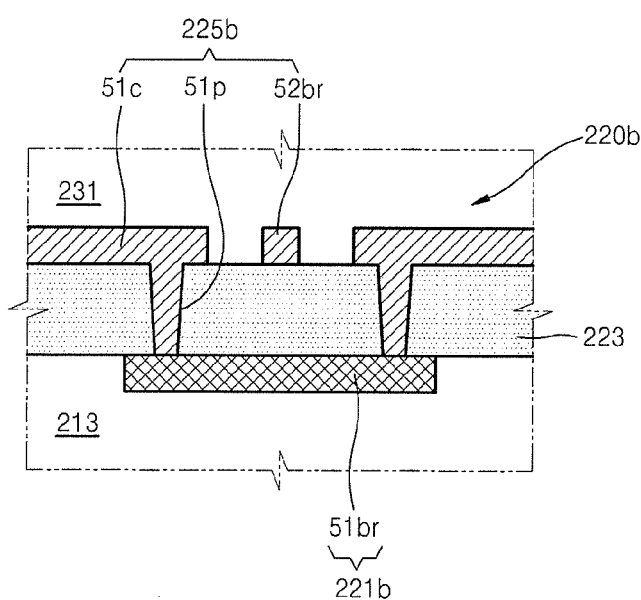
FIG. 5B is a schematic cross-sectional view of the touch sensing layer taken along the line V-V' of FIG. 5A.

FIG. 5A is a schematic plan view of a touch sensing layer 220b disposed in the thin film encapsulation layer 200 according to another embodiment of the present invention, and FIG. 5B is a schematic cross-sectional view of the touch sensing layer 220b taken along the line V-V of FIG. 5A.

Referring to FIGS. 5A and 5B, the touch sensing layer 220b disposed in the thin film encapsulation layer 200 includes first sensing patterns 51 and second sensing patterns 52.

The first sensing patterns 51 may extend in the first direction (for example, an X-axis direction). The plurality of first sensing patterns 51 may be arranged along the second direction (for example, a Y-axis direction) crossing the first direction. The first sensing patterns 51 may include a plurality of first sensing cells 51c spaced apart at suitable (e.g., predetermined) intervals in the first direction, and first connecting patterns 51br connecting the first sensing cells 51c to each other. The first connecting patterns 51br may be disposed at a different layer from that of the first sensing cells 51c, and the first sensing cells 51c may be electrically connected to the first connecting patterns 51br by using contact plugs 51p penetrating through the second inorganic layer 223. The first sensing cells 51c arranged in the first direction may be electrically connected to each other via the first connecting patterns 51br.

The second sensing patterns 52 may extend in the second direction. The plurality of second sensing patterns 52 may be arranged along the first direction. The second sensing pattern 52 may include a plurality of second sensing cells 52c that are spaced apart at suitable (or predetermined) intervals along the second direction and second connecting patterns 52br connecting the second sensing cells 52c to each other. The second sensing cells 52c may be distributed between the first sensing cells 51c so as not to overlap the first sensing cells 51c. The second connecting patterns 52br may be disposed at the same layer as that of the second sensing cells 52c, and the second connecting patterns 52br and the second sensing cells 52c may be integrally formed with each other.

The first connecting patterns 51br may be disposed on the first organic layer 213, and may configure the first touch conductive layer 221b. The first touch conductive layer 221b may be formed of a transparent conductive material, or may be formed of a low-resistive metal material such as Mo, Ag, Ti, Cu, Al, or Mo/Al/Mo.

The first sensing cells 51c, the contact plugs 51p, the second sensing cells 52c, and the second connecting patterns 52br may form (at least part of) the second touch conductive layer 225b. The second touch conductive layer 225b may be formed of a transparent conductive oxide material. The second inorganic layer 223 and the second touch conductive layer 225b may be covered by the second organic layer 231.

Figure 5C:
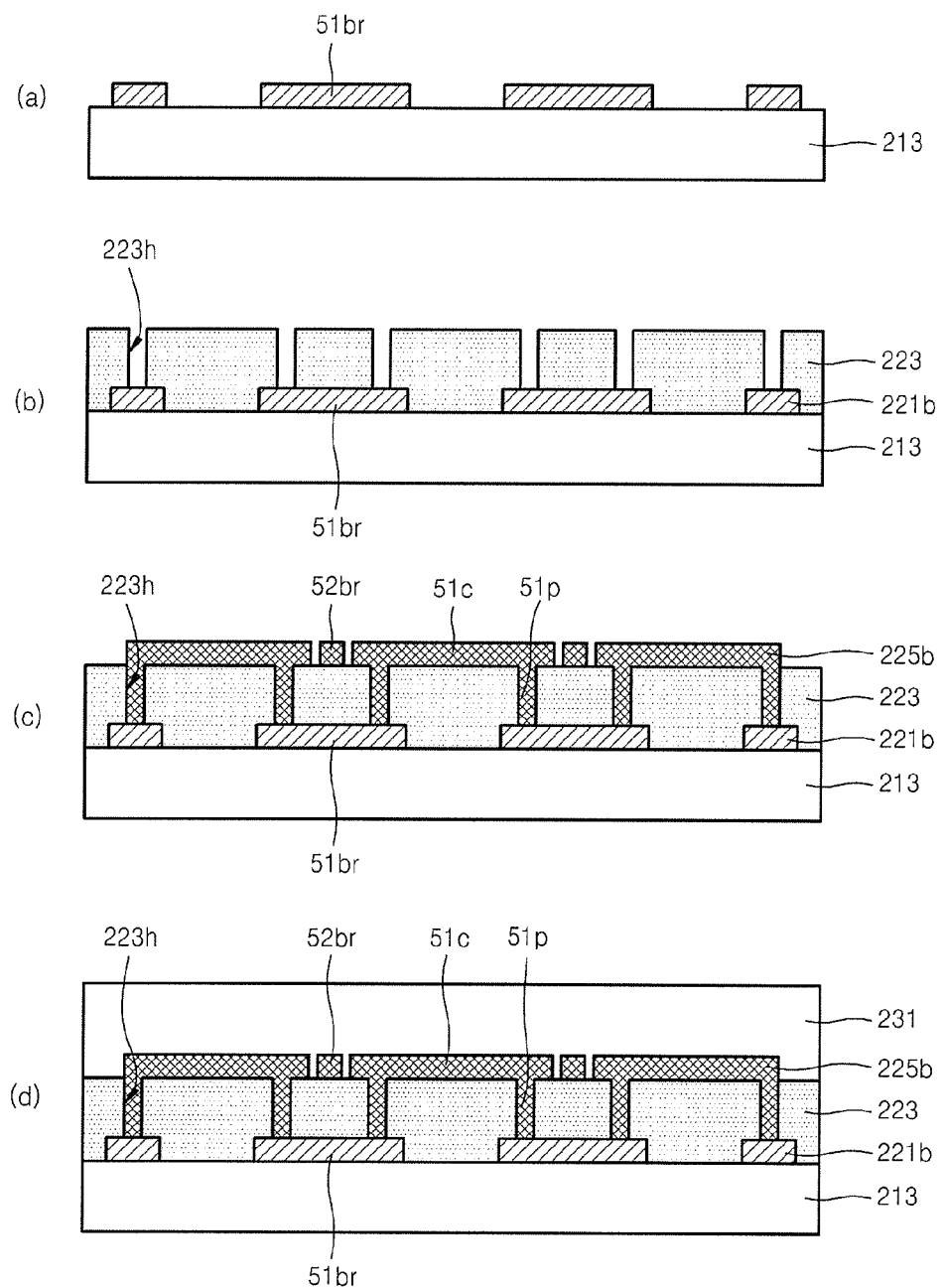
FIG. 5C depicts schematic cross-sectional views illustrating a method of forming a touch sensing layer disposed in the thin film encapsulation layer, according to an embodiment of the present invention.

FIG. 5C depicts schematic cross-sectional views illustrating a method of forming the touch sensing layer 220b disposed in the thin film encapsulation layer according to an embodiment of the present invention.

Referring to (a) of FIG. 5C, the first touch conductive layer 221b may be formed on the first organic layer 213. The first touch conductive layer 221b may include the first connecting patterns 51br. The first touch conductive layer 221b may be formed of a low-resistive metal material. For example, a low-resistive metal material layer may be disposed on the first organic layer 213. The low-resistive metal material layer may be patterned by a photolithography process using a first photo mask (not shown) and an etching process, thereby forming the first connecting patterns 51br.

Referring to (b) of FIG. 5C, the second inorganic layer 223 may be formed on the first touch conductive layer 221b. The second inorganic layer 223 may include the contact holes 223h partially exposing upper surfaces of the first connecting patterns 51br. As described above, the second inorganic layer 223 may be formed of an inorganic insulating material. In particular, an inorganic insulating material layer may be disposed on the first touch conductive layer 221b. The inorganic insulating material layer is patterned by a photolithography process using a second photo mask (not shown) and an etching process, thereby forming the contact holes 223h partially exposing the upper surfaces of the first connecting patterns 51br.

Referring to (c) of FIG. 5C, the second touch conductive layer 225b may be formed on the second inorganic layer 223. The second touch conductive layer 225b may include the first sensing cells 51c, the contact plugs 51p burying (or filling) the contact holes 223h of the second inorganic layer 223, the second sensing cells 52c, and the second connecting patterns 52br. The second touch conductive layer 225b may be formed of a transparent conductive material. For example, a transparent conductive material layer may be disposed on the second inorganic layer 223 so as to bury the contact holes 223h. The transparent conductive material layer may be patterned by a photolithography process using a third photo mask (not shown) and an etching process, thereby forming the first sensing cells 51c, the contact plugs 51p, the second sensing cells 52c, and the second connecting patterns 52br.

Referring to (d) of FIG. 5C, the second organic layer 231 may be formed on the second inorganic layer 223 and the second touch conductive layer 225b. Through the above processes, the touch sensing layer 220b disposed in the thin film encapsulation layer 200 as shown in FIG. 5B may be formed.

According to the organic light emitting display apparatus and the method of manufacturing the organic light emitting display apparatus of embodiments of the present invention, the flexible organic light emitting display apparatus accompanied with the touch screen function may be realized. Moreover, the entire thickness of the display apparatus may be reduced, manufacturing yield may be improved because an attaching process may be omitted, and thus, manufacturing costs may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:
1. An organic light emitting display apparatus comprising:
   a substrate;
   an organic light emitting diode (OLED) layer on the substrate; and
   a thin film encapsulation layer on the OLED layer comprising:
      a plurality of inorganic layers;
      a plurality of organic layers stacked with the inorganic layers; and
      a touch sensing layer comprising:
         a first touch conductive layer;
         a touch insulating layer on the first touch conductive layer; and a second touch conductive layer on the touch insulating layer,
wherein the touch insulating layer is between the substrate and an organic layer from among the plurality of organic layers.

2. The organic light emitting display apparatus of claim 1, wherein the OLED layer comprises:
a pixel electrode on the substrate;
an intermediate layer on the pixel electrode comprising an organic emission layer; and
an opposite electrode on the intermediate layer.

3. The organic light emitting display apparatus of claim 1, wherein the first touch conductive layer comprises:
a plurality of first sensing cells arranged along a first direction on the substrate;
a plurality of first connecting patterns for connecting the first sensing cells to each other; and
a plurality of second sensing cells arranged along a second direction on the substrate, and
wherein the second touch conductive layer comprises:
contact plugs in the touch insulating layer electrically connected to portions of the second sensing cells; and
a plurality of second connecting patterns electrically connecting the second sensing cells to each other via the contact plugs.

4. The organic light emitting display apparatus of claim 3, wherein the first touch conductive layer comprises a transparent conductive oxide material.

5. The organic light emitting display apparatus of claim 1, wherein the second touch conductive layer comprises:
a plurality of first sensing cells arranged along a first direction on the substrate;
a plurality of first connecting patterns electrically connecting the first sensing cells to each other;
a plurality of second sensing cells arranged along a second direction on the substrate; and
contact plugs in the touch insulating layer electrically connected to portions of the second sensing cells, and
wherein the first touch conductive layer comprises a plurality of second connecting patterns electrically connecting the second sensing cells to each other via the contact plugs.

6. The organic light emitting display apparatus of claim 5, wherein the second touch conductive layer comprises a transparent conductive oxide material.

7. The organic light emitting display apparatus of claim 1, wherein the thin film encapsulation layer further comprises:
a first inorganic layer on the OLED layer;
a first organic layer on the first inorganic layer;
the touch insulating layer on the first organic layer;
a second organic layer on the touch insulating layer;
a second inorganic layer on the second organic layer; and
a transparent conductive oxide layer interposed between the touch insulating layer and the first organic layer or the second organic layer.

8. The organic light emitting display apparatus of claim 7, wherein the thin film encapsulation layer further comprises:
a third inorganic layer on the first organic layer; and
the touch insulating layer on the third inorganic layer.

9. The organic light emitting display apparatus of claim 1, wherein the organic layers of the thin film encapsulation layer comprise a lower organic layer under the touch insulating layer and an upper organic layer on the touch insulating layer,
wherein the first touch conductive layer is directly between the lower organic layer and a bottom surface of the touch insulating layer, and
wherein the second touch conductive layer is directly between an upper surface of the touch insulating layer and the upper organic layer.

10. The organic light emitting display apparatus of claim 1, wherein the substrate is a flexible substrate.

11. The organic light emitting display apparatus of claim 1, further comprising a protective layer between the OLED layer and the thin film encapsulation layer.

12. The organic light emitting display apparatus of claim 1, further comprising an optical member on the thin film encapsulation layer.

13. The organic light emitting display apparatus of claim 1, wherein the plurality of inorganic layers and the plurality of organic layers are alternately stacked.

14. A method of manufacturing an organic light emitting display apparatus, the method comprising:
sequentially forming a pixel electrode, an intermediate layer comprising an organic emission layer, and an opposite electrode on a substrate; and
forming a thin film encapsulation layer comprising a plurality of inorganic layers on the opposite electrode; a plurality of organic layers stacked with the inorganic layers on the opposite electrode; and a touch sensing layer,
wherein the touch sensing layer is between the substrate and an organic layer from among the plurality of organic layers.

15. The method of claim 14, wherein the sequentially forming the pixel electrode, the intermediate layer comprising the organic emission layer, and the opposite electrode on the substrate comprises:
forming the pixel electrode on the substrate;
forming a pixel defining layer that defines a pixel region and covers opposite edges of the pixel electrode;
forming the intermediate layer comprising the organic emission layer on a region defined by the pixel defining layer; and
forming the opposite electrode so as to cover the intermediate layer and the pixel defining layer.

16. The method of claim 14, wherein the forming of the thin film encapsulation layer comprises:
forming a first inorganic layer on the opposite electrode;
forming a first organic layer on the first inorganic layer;
forming the touch sensing layer on the first organic layer;
forming a second organic layer on the touch sensing layer; and
forming a second inorganic layer on the second organic layer.

17. The method of claim 14, wherein the forming of the touch sensing layer comprises:
forming a first touch conductive layer;
forming a touch insulating layer on the first touch conductive layer; and
forming a second touch conductive layer on the touch insulating layer,
wherein the touch insulating layer comprises one of the inorganic layers of the thin film encapsulation layer.

18. An organic light emitting display apparatus comprising:
a substrate;
an organic light emitting diode (OLED) layer on the substrate;
a thin film encapsulation layer on the OLED layer comprising:
a plurality of inorganic layers;
a plurality of organic layers stacked with the inorganic layers; and a touch sensing layer comprising a touch insulating layer,
wherein the touch insulating layer is between two successive organic layers among the organic layers.

19. The organic light emitting display apparatus of claim 18, wherein the touch sensing layer further comprises a first touch conductive layer under the touch insulating layer, and a second touch conductive layer on the touch insulating layer.

20. The organic light emitting display apparatus of claim 19, wherein at least one of the first touch conductive layer and the second touch conductive layer comprises a transparent conductive oxide material, and the thin film encapsulation layer further comprises the layer that comprises the transparent conductive oxide material.

\* \* \* \* \*